United States Patent [19]

Yukawa

[11] Patent Number: 4,963,834
[45] Date of Patent: Oct. 16, 1990

[54] OPERATIONAL AMPLIFIER

[75] Inventor: Akira Yukawa, Tokyo, Japan

[73] Assignee: NEC Corporation, Tokyo, Japan

[21] Appl. No.: 299,390

[22] Filed: Jan. 23, 1989

[30] Foreign Application Priority Data

Jan. 21, 1988 [JP] Japan ................................. 63-11958
Jan. 21, 1988 [JP] Japan ................................. 63-11959

[51] Int. Cl.⁵ ............................................. H03F 3/45
[52] U.S. Cl. .................................... 330/253; 330/255; 330/257
[58] Field of Search ............... 330/252, 253, 255, 257, 330/277, 307, 310, 311

[56] References Cited

U.S. PATENT DOCUMENTS 4,829,266 5/1989 Pernici et al. .................... 330/253

OTHER PUBLICATIONS

"High-Frequency CMOS Switched-Capacitor ... Applications", 1983 IEEE International Solid-State Circuits Conference, p. 314.

D. Ribner et al., "Design Techniques for Cascoded ... Range", IEEE Journal of Solid-State Circuits, vol. SC-19, No. 6, Dec. 1984, pp. 919-925.

Primary Examiner—Steven Mottola
Attorney, Agent, or Firm—Sughrue, Mion, Zinn, Macpeak & Seas

[57] ABSTRACT

An operational amplifier comprises a differential input stage, first and second folded cascode stages connected to the differential input stage, and first and second output inverting amplifiers. The first output inverting amplifier is driven by the output of the first folded cascode stage, and the second output inverting amplifier is driven through a current mirror by the output of the second folded cascode stage, such that a push pull output stage is provided in the operational amplifier. As a result, a driving performance is much improved in regard to a capacitive load, and a range of an output voltage can be expanded equally to a power supply voltage.

4 Claims, 5 Drawing Sheets

OPERATIONAL AMPLIFIER

FIELD OF THE INVENTION

The invention relates to an operational amplifier, and more particularly to an operational amplifier which is constructed on an integrated circuit.

BACKGROUND OF THE INVENTION

One type of an operational amplifier which produces balanced output is described on page 314 of "1983 IEEE International Solid State Circuits Conference, Digest of Technical Papers". In a circuit for the operational amplifier, a differential amplifying transistor pair including two N channel MOS transistors (N channel MOS transistor is called simply as "MN" hereinafter) is connected to a constant current source including a MN, to a gate electrode of which a constant voltage is applied, and two parallel MNs, to gate electrodes of which an analog ground voltage is applied. In the differential amplifying transistor pair, gate electrodes of the two MNs are connected to balanced input terminals, while drain electrodes for outputs thereof are connected to source electrodes of a folded cascade transistor pair including two P channel MOS transistors (P channel MOS transistor is called simply as "MP" hereinafter). Drain electrodes of the folded cascode transistor pair are connected to a constant current source including four MNs.

In the circuit of the operational amplifier, an amplifying circuit is provided by one stage, so that a gain is obtained in accordance with a resistance value of a load. Therefore, there are disadvantages that a load of a large capacitance is difficult to be driven because an ability for driving a capacitive load is limited due to a mutual conductance of the input differential amplifying transistor pair and a capacitance value of the load, that a current consumption is large because a current flowing through the constant current source which is a bias current for the operational amplifier must be large to increase a lowering rate of an output voltage which is defined as a slewing-rate for the reason why the slewing-rate is limited due to a current value for the constant current source, and that a range of an output voltage is narrow because the number of MOS transistors is large to be connected in series between two power supply lines. These disadvantages are detrimental to an operational amplifier which is used for a large scaled integration circuit.

The other type of an operational amplifier which includes two-stage amplifying circuits to enhance an output driving ability is described on pages 919 to 925 of "IEEE Journal of Solid-State Circuits, Vol. SC-19, No. 6, Dec. 1984". In a circuit of the operational amplifier, a differential transistor pair including two MPs is connected to a constant current source of a MP, such that source electrodes of the two MPs are commonly connected to the constant current source, and a constant voltage is applied to a gate electrode of the MP for the constant current source. Input terminals are connected to the differential transistor pair, drain electrodes of which are connected to, source electrodes of two MNs for a folded cascode stage constructed together with two MPs of a current mirror circuit. In the folded, cascode stage, gate electrodes of the two MNs are connected to a reference voltage input terminal, and source electrodes of the two MPs are connected to a first power supply line. The current mirror circuit is connected to a constant current source including two MNs, source electrodes of which are connected a second power supply line. Output of the folded cascode stage is amplified in an inverting amplifier including a MP for a driving transistor and a MN for a constant current load, and then supplied from an output terminal of the operational amplifier to a following stage.

In the operational amplifier, a range of an input voltage can be large, and an output voltage can be lowered down to a voltage approximately equal to a negative voltage of the second power supply line.

According to the latter operational amplifier, however, there are disadvantages that a current consumption is large because a current flowing through the MN for the constant current load must be large to increase a slewing-rate of lowering an output voltage in a case where a capacitive load is connected thereto and an output signal of a large amplitude is supplied therefrom, and that an output voltage can not be increased up to the upper level of a power supply voltage because the output voltage is limited due to the aforementioned current and a resistance of the MP which is turned on for the driving transistor. These disadvantages do not allow the latter operational amplifier to be used for an operational amplifier realized on a large scaled integration circuit.

SUMMARY OF THE INVENTION

Accordingly, it is an object of the invention to provide an operational amplifier in which a slewing-rate is increased.

It is a further object of the invention to provide an operational amplifier in which a current consumption is prevented from being increased.

It is a still further object of the invention to provide an operational amplifier from which a wide range of an output voltage is obtained.

According to the invention, an operational amplifier comprises a differential input stage to which input terminals are connected, two folded cascode stages connected to the differential input stage, an inverting amplifier including two transistor for receiving outputs of the first and second folded cascode stages, a current mirror inserted between the first folded cascode stage and a corresponding one of the two transistors, and an output terminal connected to a connecting point of the two transistor, wherein one of the two transistors is driven by the output of the second folded cascode stage, and the other of the two transistors is driven through the current mirror by the output of the first folded cascode stage, so that amplified output is supplied from the output terminal.

BRIEF DESCRIPTION OF THE DRAWINGS

The invention will be explained in more detail in conjunction with appended drawings wherein.

DESCRIPTION OF PREFERRED EMBODIMENTS

Before describing an operational amplifier in the first embodiment according to the invention, the aforementioned former and latter operational amplifiers will be explained in FIGS. 1 and 2.

Figure 1:
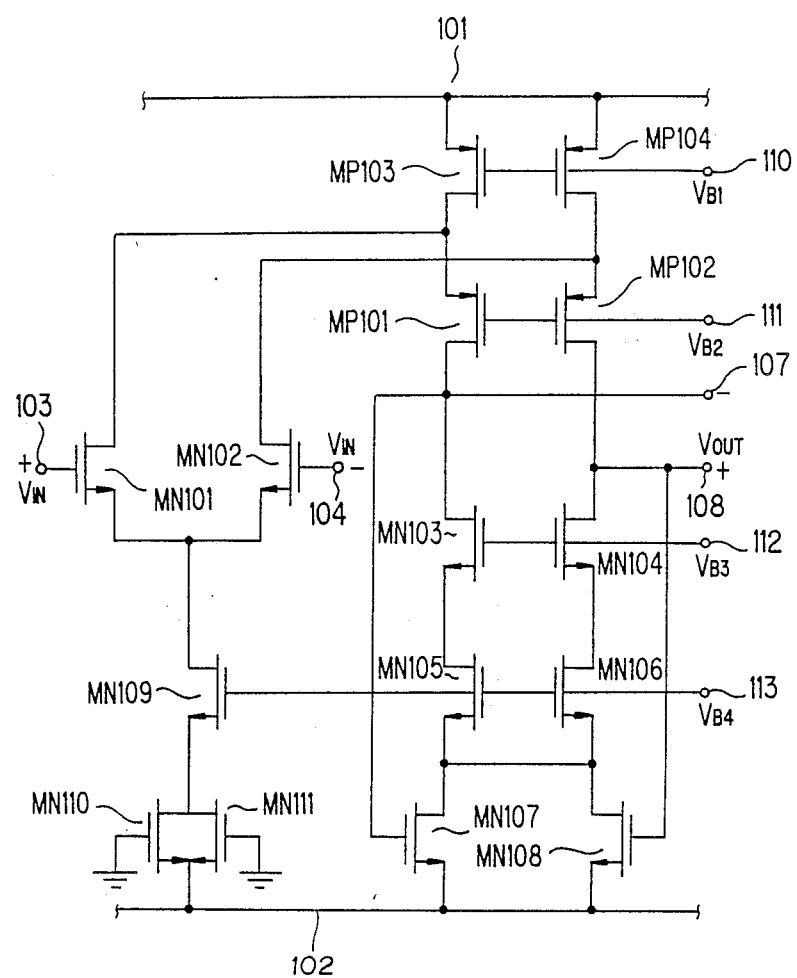
FIGS. 1 and 2 are schematic diagrams showing two types of conventional operational amplifiers.

FIG. 1 shows the former operational amplifier in which a differential amplifying transistor pair is connected to a constant current source. The differential amplifying transistor pair includes MNs 101 and 102 having gate electrodes connected to input terminals 103 and 104, across which a voltage $V_{IN}$ is applied, and the constant current source includes MN 109 having a gate electrode connected to a terminal 113, to which a voltage $V_{B4}$ is applied, and MNs 110 and 111 having gate electrodes, to which analog ground voltage is applied. In the operational amplifier, further, drain electrodes of the differential amplifying transistor pair are connected to source electrodes of a folded cascode transistor pair including MPs 101 and 102. Drain electrodes of the folded cascode transistor pair are connected to a constant current source including MNs 103 to 106, so that the constant current source operates as a load to provide a high gain therein. The folded cascode transistor pair is connected through a MOS transistor pair including MPs 103 and 104 to a positive voltage of a first power supply line 101, and the constant current source is connected through a MOS transistor pair including MNs 107 and 108 to a negative voltage of a second power supply line 102. The MNs 107 and 108 function to set an operating center point for an output voltage $V_{OUT}$ of balanced output terminals 107 and 108. Gate electrodes for the MPs 103 and 104, the MPs 101 and 102, and the MNs 103 and 104 are connected to terminals 110, 111, and 112, respectively, to which constant voltages $V_{B1}$, $V_{B2}$ and $V_{B3}$ are applied. The aforementioned disadvantages of the former operational amplifier are not explained here.

Figure 2:
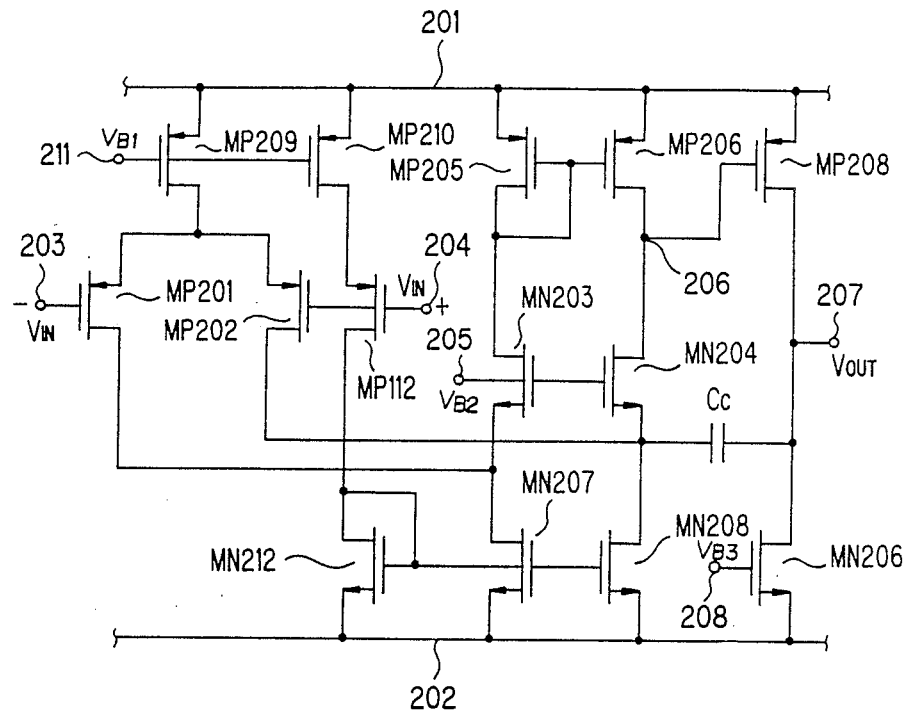

FIG. 2 shows the latter operational amplifier in which a differential transistor pair is connected to a constant current source transistor. The differential transistor pair includes MPs 201 and 202 having gate electrodes connected to input terminals 203 and 204, across which an input voltage $V_{IN}$ is applied, and the constant current source transistor is MP 209 having a gate electrode, to which a constant voltage $V_{B1}$ is applied. The differential transistor pair is further connected through drain electrodes thereof to a folded cascode stage including MNs 203 and 204 connected to MPs 205 and 206 of a current mirror circuit, source electrodes of which are connected to a positive voltage of a first power supply line 201. The current mirror circuit in which a constant voltage $V_{B2}$ is applied to a terminal thereof is connected to a constant current source including MNs 207 and 208, source electrodes of which are connected to a negative voltage of a second power supply line 202. Output, as indicated by a reference numeral 206, of the folded, cascode stage is supplied to be further amplified to a reverting amplifier including MP 208 for a driving transistor and MN 206, to a gate electrode of which a constant voltage $V_{B3}$ is applied, for a load transistor, so that output $V_{OUT}$ thus amplified is supplied from an output terminal 207 to a following stage. In the operational amplifier, MPs 210 and 21 2, and MN 212 are interconnected as shown in FIG. 2, and a capacitor $C_C$ for a phase compensation is inserted between the folded cascode stage and the output terminal 207. The aforementioned disadvantages of the latter operational amplifier are not explained here.

Figure 3:
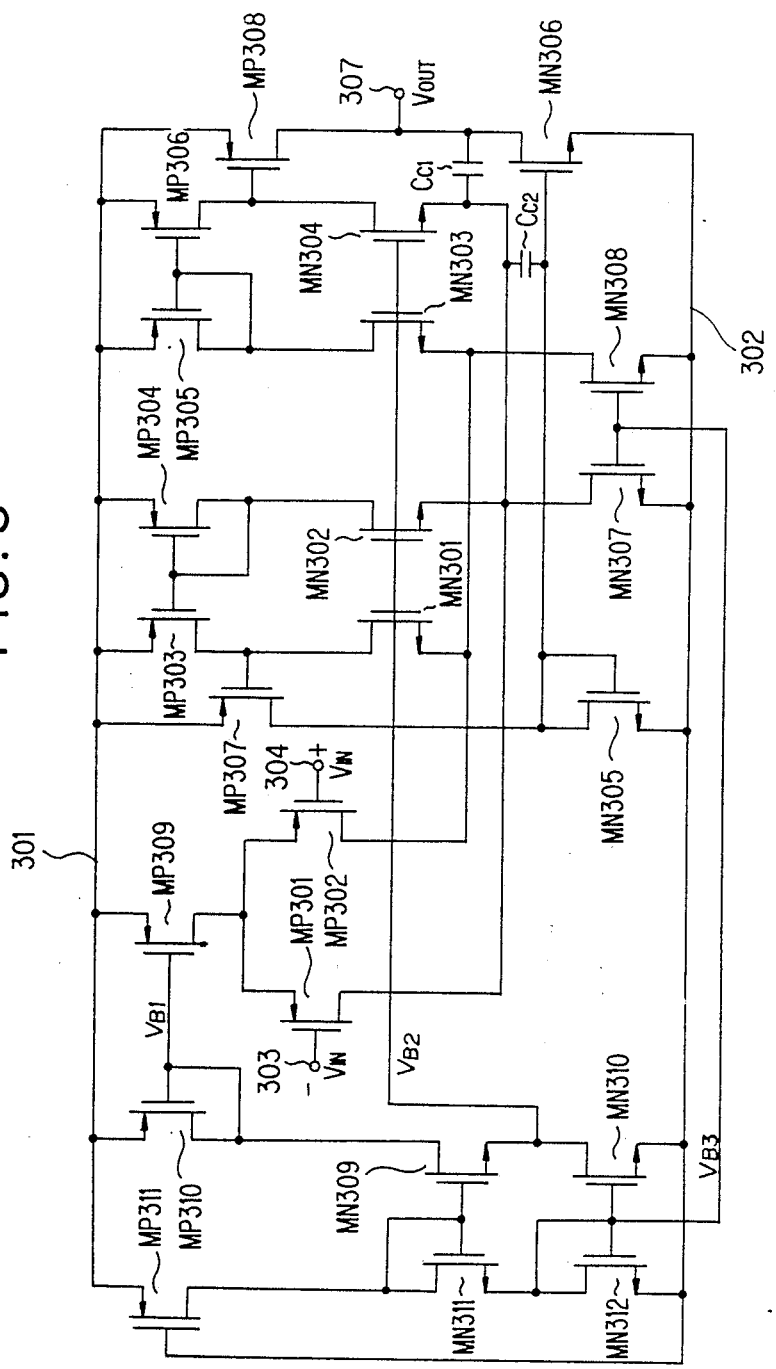
FIGS. 3 and 4 are schematic diagrams showing operational amplifiers in first and second embodiments according to the invention.

Next, an operational amplifier in the first embodiment according to the invention will be explained in FIG. 3. In the operational amplifier, there is provided a reference bias voltage producing circuit including MPs 310 and 311, and MNs 309 to 311, from which reference bias voltages $V_{B1}$, $V_{B2}$ and $V_{B3}$ are supplied to respective P and N channel MOS transistors as shown therein, and a differential transistor pair is connected to a constant current source. The differential transistor pair includes MPs 301 and 302, source electrodes of which are commonly connected to a drain electrode of MP 309 for the constant current source, and source electrode of the MP 309 is connected to a first power supply line 301. Gate electrodes of the MPs 301 and 302 are connected to input terminals 303 and 304, across which an input voltage $V_{IN}$ is applied. The differential transistor pair is connected through drain electrodes of the MPs 301 and 302 to source electrodes of MNs 301 and 302 for a first folded cascode stage which further includes MPs 303 and 304 of a current mirror, so that input signal supplied from the differential transistor pair to the first folded cascode state is amplified therein, and signal thus amplified is supplied from a node 305 to a base electrode of MP 307. The differential transistor pair is further connected to a second folded cascode stage in the symmetry connecting pattern relative to the first folded cascode stage. The second folded cascode stage includes MNs 303 and 304, source electrodes of which are connected to the drain electrodes of the MPs 301 and 302, and MPs 305 and 306 of a current mirror current input and output terminals of which are connected to drain electrodes of the MNs 303 and 304. Input signal supplied from the differential transistor pair to the second folded cascode stage is amplified therein, and signal thus amplified is supplied from a node 306 to a base electrode of MP 308. In the first and second folded cascode stages, source electrodes of the MPs 303 and 304, and those of the MPs 305 and 306 are connected to the first power supply line 301, and directions of reverting currents are opposite as clearly understood from the circuit patterns in FIG. 3. As a result, the output signals at the nodes 305 and 306 are out of phase. The first and second folded cascode stages are current-biased by MNs 307 and 308, source electrodes of which are connected to a second power supply line 302, and gate electrodes of which are biased by the reference bias voltage $V_{B3}$ of the reference voltage producing circuit. The output voltages generated at the nodes 305 and 306 of the first and second folded cascode stages are converted to current signals by the MPs 307 and 308. The current signal of the MP 307 is supplied through a mirror circuit including MNs 305 and 306 to an output terminal 307. The MN 306 and the MP 308 provide a push pull output circuit, and capacitors $C_{C1}$ and $C_{C2}$ are provided for the compensation of phase.

In operation, the input voltages $\pm V_{IN}$ are applied to the input terminals 303 and 304, and current signals corresponding to the input voltages $\pm V_{IN}$ are supplied from the differential transistor pair to the first and second folded cascode stages, at the output nodes 305 and 306 of which amplified voltages are generated. The output of the node 305 is reverted by the MP 307 and the MN 305, so that the MN 306 is driven by the reverted signal, while the output of the node 306 is applied to the MP 308 which is thereby driven. The both outputs are further amplified in the MP 308 and the MN 306, and the output signal thus amplified is supplied from the output terminal 307 to a following stage.

In the embodiment, the P channel MOS transistors and the N channel MOS transistors may be exchanged.

In the operational amplifier explained above, the output voltage can be decreased down to a voltage equal to a voltage of the second power supply line 302 because voltage of the node 306 is increased up to a voltage of the first power supply line 301 at the maximum so that the MP 308 is turned off. While, the output voltage can be increased up to a voltage equal to a voltage of the first power supply line 301 because a voltage of the node 305 is increased up to a voltage of the first power supply line 301 so that the MP 307 is turned off to result in the turning-off of the MN 305, and then that of the MN 306. Further, current flowing through the output stage can be small because the disadvantage in the conventional operational amplifier that current consumption is increased, when a rate of rising up and falling down in driving a capacitive load is increased, is solved for the reason why the output stage includes an N channel MOS transistor and a P channel MOS transistor to provide a push pull circuit which is controlled by an input signal in the invention. Accordingly, an operational amplifier in which advantages that current consumption is small, driving ability is high, and a range of output voltage is wide is provided in the invention.

Figure 4:
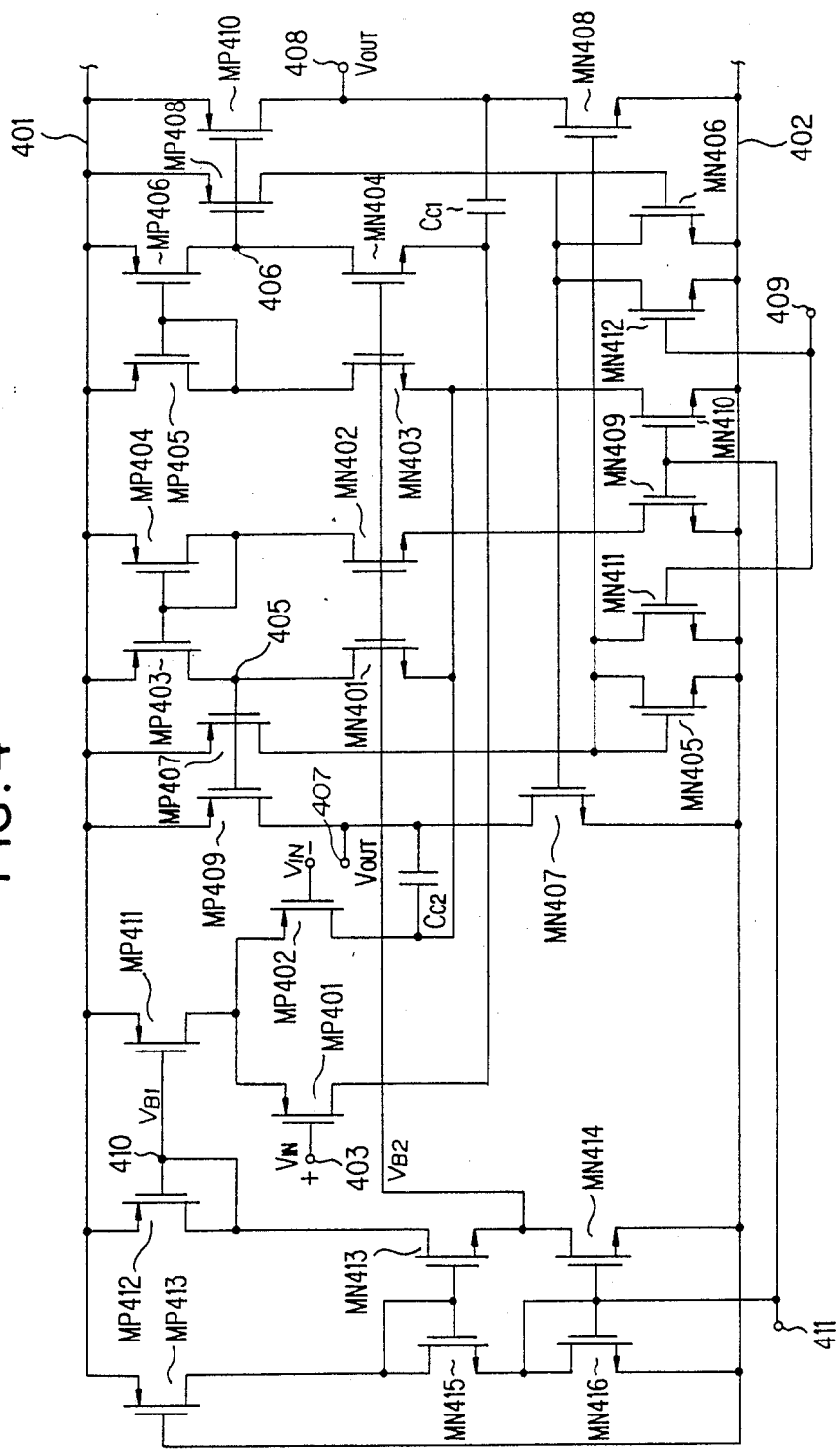

FIG. 4 shows an operational amplifier in the second embodiment according to the invention. In the operational amplifier, there is provided a reference voltage producing circuit including MPs 12 and 13, and MNs 13 to 16 for producing reference bias voltages $V_{B1}$ and $V_{B2}$, and a differential transistor pair is connected to a constant current source. The differential transistor pair includes MPs 401 and 402 having gate electrodes, to which input terminals 403 and 404 are connected, and source electrodes commonly connected to a drain electrode of MP 411 included in the constant current source, in which a source electrode of the MP 411 is connected to a first power supply line 401, and a gate electrode thereof is biased by the reference bias voltage $V_{B1}$. There is provided a first folded cascode stage including MNs 401 and 402, and MPs 403 and 404 wherein source electrodes of the MNs 401 and 402 are connected to drain electrodes of the MPs 401 and 402, gate electrodes thereof are biased by the reference bias voltage $V_{B2}$, and drain electrodes thereof are connected to current input and output terminals of the MPs 403 and 404 of a current mirror. Signal supplied to the first folded cascode stage is amplified therein and supplied from a node 405 thereof to MP 409. There is further provided a second folded cascode stage including MNs 403 and 404 having source electrodes connected to the drain electrodes of the MPs 401 and 403 commonly with the source electrodes of the MNs 401 and 402, and gate electrodes biased by the reference bias voltages $V_{B2}$, and MPs 405 and 406 of a current mirror having current input and output terminals connected to drain electrodes of the MNs 403 and 404, and source electrodes connected to the first power supply line 401. The MNs 403 and 404, and the MPs 405 and 406 are interconnected wherein signals supplied to the source electrodes are amplified therein to provide an amplified signal at a node 406 thereof. The first and second folded cascode stages are of a relation of symmetry, and outputs at the nodes 405 and 406 are out of phase. The first and second folded cascode stages are current-biased by a constant current source pair of MNs 409 and 410 having gate electrodes, to which a constant voltage is applied from a terminal 411. Output at the node 405 of the first folded cascode stage is converted to current signal by MP 407, and the current signal thus converted is supplied through MNs 405 and 408 to an output terminal 408. On the other hand, output at the node 6 of the second folded cascode stage is supplied through MP 410 to the output terminal 408. An output stage including the MN 408 and the MP 410 is of a push pull circuit. There is further provided an output stage including MPs 408 and 409, and MNs 406 and 407 wherein an output signal is obtained at an output terminal 407. The operational amplifier further comprises MNs 411 and 412 having gate electrodes connected to a terminal 409, from which a constant voltage is applied thereto, source electrodes connected to a second power supply line 402, and drain electrodes connected to gate electrodes of the MNs 407 and 408, so that the same phase components of the two outputs are stabilized at two output terminals 407 and 408, and capacitors $C_{C1}$ and $C_{C2}$ for compensating phases.

In operation, input signals $\pm V_{IN}$ are applied to the input terminals 403 and 404, and amplified in the first and second folded cascode stages. Signals thus amplified are obtained at the nodes 405 and 406. The output at the node 406 drives the MP 410 to be turned on, and the output at the node 405 is reversed by the MP 407 and the MN 405, and then drive the MN 408 to be turned on. Outputs of the MP 410 and the MN 408 providing a push pull structure are supplied from the output terminal 408 as $V_{OUT1}$ after being amplified therein. Simultaneously, the output at the node 405 drives the MP 409 to be turned on, and the output at the node 406 is reversed by the MP 408 and the MN 406, and then drive the MN 407 to be turned on. Outputs of the MP 409 and the MN 407 providing a push pull structure are supplied from the output terminal 407 as $V_{OUT2}$ after being amplified therein. The outputs $V_{OUT1}$ and $V_{OUT2}$ provides a balanced output.

In general, it can not be avoided that operating points of outputs are changed from a designed value in a balanced type operational amplifier due to a fluctuation of device properties. Therefore, the difference of two outputs is produced, even if the same level of two inputs are applied to input terminals. Even in such a case, the difference can be corrected in accordance with an input offset voltage. However, in a case where the operating points of the outputs are deviated at the same phase, such a deviation can not be corrected at the input terminals. In this point, the MNs 411 and 412 is a current source for compensating the deviation of the same phase, so that voltages $V_{OUT1}$ and $V_{OUT2}$ of the outputs are increased by increasing voltages applied to the gate electrodes of the MNs 411 and 412.

Figure 5A:
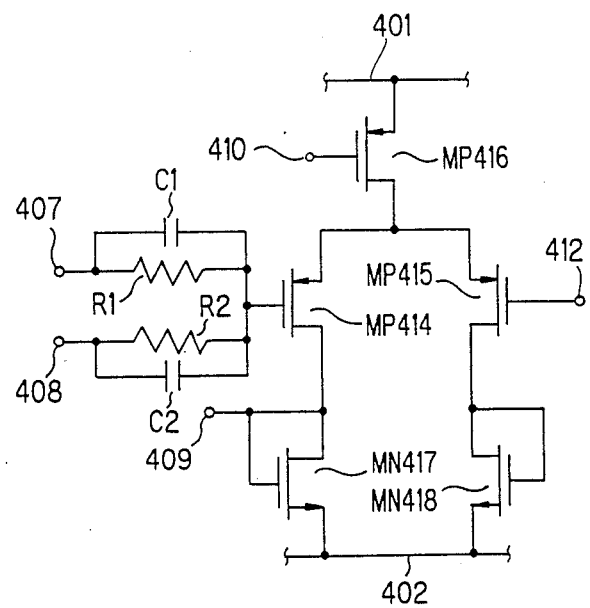
FIGS. 5A and 5B are schematic diagrams showing circuits for setting an output operation point used in the operational amplifier in FIG. 4.
Figure 5B:
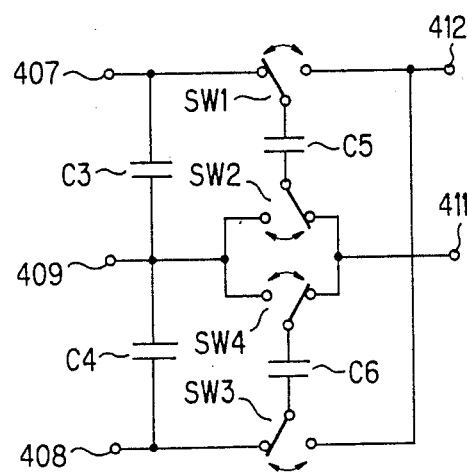

For this purpose, feedback circuits as shown in FIGS. 5A and 5B may be applied to thereto. FIG. 5A shows the first feedback circuit comprising MP 416, a source electrode of which is connected to the first power supply line 401 and a base electrode of which is connected to a constant voltage applied node 410, MPs 414 and 415, source electrodes of which are commonly connected to a drain electrode of the MP 416, and MNs 417 and 418, source electrodes of which are connected to the second power supply line 402 wherein the aforementioned two output terminals 407 and 408 are connected through two parallel circuits having capacitors $C_1$ and $C_2$ of an equal capacitance and resistors $R_1$ and $R_2$ of an equal resistance value to a gate electrode of the MP 414, and a gate electrode of the MP 415 is connected to a constant voltage applied node 412.

In operation, a middle point voltage of the two outputs $V_{OUT1}$ and $V_{OUT2}$ is obtained at the connecting point of the two parallel circuits, so that the difference between the middle point voltage and a reference operating center voltage applied to the node 412 is differentially amplified and then supplied from the node 409 for the control of a feedback.

FIG. 5B shows the second feedback circuit comprising capacitors $C_3$ and $C_4$ of an equal capacitance connected between the aforementioned output terminals 407 and 408 and a node 409, and capacitors $C_5$ and $C_6$ of an equal capacitance to be switched over by switches $SW_1$ to $SW_4$ as shown by arrows.

In operation, an AC middle point voltage of the two output $V_{OUT1}$ and $V_{OUT2}$ is obtained at a node 409 by the capacitors $C_3$ and $C_4$, and a DC voltage is regulated by the capacitors $C_5$ and $C_6$ which are switched over by the switches $SW_1$ to $SW_4$ as explained below. At a first time slot, the switch $SW_1$ is turned on the output terminal 407, the switch $SW_3$ is turned on the output terminal 408, and the switches $SW_2$ and $SW_4$ are turned on a node 411 to which the reference voltage producing circuit as shown in FIG. 4 is connected. At a second time slot, the switches $SW_1$ and $SW_2$ are turned on a node 412 to which a reference operating center voltage is applied from an external circuit, and the switches $SW_2$ and $SW_4$ are turned on the node 409.

In the two operating modes, a sum of voltage differences between the two output voltages $V_{OUT1}$ and $V_{OUT2}$ and the reference operating voltage is obtained, so that the sum is subtracted from a voltage of the reference voltage producing circuit to produce a subtracted voltage. The subtracted voltage and charges of a capacitance sum of the capacitors $C_5$ and $C_6$ are supplied from the node 409, and a voltage of the node 409 is determined to be a value by which a charge amount of the capacitance sum becomes zero. The charge amount of zero is achieved in a case where the sum of the voltage difference is zero, that is, a mean value of voltages at the output terminals 407 and 408 is equal to a voltage of the node 412.

As explained above, the voltage $V_{OUT1}$ at the output terminal 408 is decreased down to a voltage of the second power supply line 402 because a voltage at the node 406 is increased up to a voltage of the first power supply line 401 so that the MPs 408 and 409 are turned off, while the voltage $V_{OUT2}$ at the output terminal 407 is increased up to a voltage of the first power supply line 401 because current does not flow through the MN 406 so that the MN 407 is turned off. On the other hand, a voltage at the node 405 is increased up to a voltage of the first power supply line 401 so that the MPs 407 and 409 are turned off, and current does not flow through the MN 5 and thus through the MN 8. In this case, the voltage $V_{OUT1}$ at the output terminal 48 is increased up to a voltage of the first power supply line 401, and the voltage $V_{OUT2}$ at the output terminal 407 is decreased down to a voltage of the second power supply line 402. Further, the operational amplifier comprises the two stage amplifiers so that an output driving ability depends on a product between a gain of the first folded cascode amplifying stage and a mutual conductance sum of the push pull output stage, thereby improving the output driving performance much better than that in the conventional operational amplifier. Still further, the output stage is of a push pull structure so that a slewing-rate becomes high and power consumption becomes low because current for preventing the slewing-rate from being improved does not flow in the output stage.

Although the invention has been described with respect to specific embodiment for complete and clear disclosure, the appended claims are not to thus limited but are to be construed as embodying all modification and alternative constructions that may occur to one skilled in the art which fairly fall within the basic teaching herein set forth.

What is claimed is:

1. An operational amplifier comprising,
   a differential input stage to which input terminals are connected,
   first and second folded cascode stages connected to said differential input stage, and driven by a common output of said differential input stage,
   an inverting amplifier including two transistors, one of said two transistors being connected through a current mirror to said first folded cascade stage, and the other of said two transistors being connected directly to the second folded cascode stage.
   an output terminal connected to a connecting point of said two transistors.

2. An operational amplifier comprising,
   a constant current source connected to a first power supply line,
   a differential transistor pair being a first polarity and connected through source electrodes thereof commonly to said constant current source,
   input terminals connected to gate electrodes of said differential transistor pair,
   a first folded cascode stage including first and second transistor pairs, said first transistor pair being said first polarity and providing a first current mirror based on said first power supply line, and said second transistor pair being a second polarity and connected through drain electrodes thereof to said first current mirror, through gate electrodes thereof to a reference voltage source, and through source electrodes thereof respectively to drain electrodes of said differential transistor pair,
   a second folded cascode stage including third and fourth transistor pairs, said third transistor pair being said first polarity, providing a second current mirror based on said first power supply line, and having a connecting pattern of symmetry relatively to said first current mirror, and said fourth transistor pair being said second polarity and connected through drain electrodes thereof to said second current mirror, through gate electrodes thereof to said reference voltage source, and through source electrodes thereof respectively to said drain electrodes of said differential transistor pair,
   a current source transistor pair being said second polarity and connected through drain electrodes thereof to respective ones of said source electrodes of said second and fourth transistor pairs included in said first and second folded cascode stages, and through source electrodes thereof to a second power supply line,
   an output transistor pair being said first polarity and connected through drain electrodes thereof to a third current mirror and through gate electrodes thereof respectively to said first and second folded cascode stages, said third current mirror including a transistor pair of said second polarity and based on said second power supply line, and an output terminal connected to a connecting point between a transistor of said output transistor pair and said third current mirror.

3. An operational amplifier according to claim 2, wherein said reference voltage source produces first, second and third reference voltages, said first reference voltage being applied to said constant current source, said second reference voltage being applied to said first and second folded cascode stages, and said third reference voltage being applied to said current source transistor pair.

4. An operational amplifier comprising, a constant current source connected to a first power supply line, a differential transistor pair being a first polarity and connected through source electrodes thereof commonly to said constant current source, input terminals connected to gate electrodes of said differential transistor pair, a first folded cascode stage including first and second transistor pairs, said first transistor pair being said first polarity and providing a first current mirror based on said first power supply line, and said second transistor pair being a second polarity and connected through drain electrodes thereof to said first current mirror, through gate electrodes thereof to a reference voltage source, and through source electrodes thereof respectively to drain electrodes of said differential transistor pair, a second folded cascode stage including third and fourth transistor pairs, said third transistor pair being said first polarity, providing a second current mirror based on said first power supply line, and having a connecting pattern of symmetry relatively to said first current mirror, and said fourth transistor pair being said second polarity and connected through drain electrodes thereof to said second current mirror, through gate electrodes thereof to said reference voltage source, and through source electrodes thereof respectively to said drain electrodes of said differential transistor pair, a current source transistor pair being said second polarity and connected through drain electrodes thereof to respective ones of said source electrodes of said second and fourth transistor pairs included in said first and second folded cascode stages, and through source electrodes thereof to a second power supply line, two transistor pairs each being said first polarity and connected through gate electrodes thereof respectively to said first and second folded cascode stages, and through drain electrodes thereof to a corresponding one of third and fourth current mirrors, said third and fourth current mirrors each including a transistor pair of said second polarity, and positive and negative output terminals connected to connecting points between said two transistor pairs and said third and fourth current mirrors.

* * * * *

UNITED STATES PATENT AND TRADEMARK OFFICE
CERTIFICATE OF CORRECTION

PATENT NO. : 4,963,834

DATED : October 16, 1990

INVENTOR(S) : Akira YUKAWA

It is certified that error appears in the above-identified patent and that said Letters Patent is hereby corrected as shown below:

Col. 3, line 65, delete "21 2" and insert --212--;

Col. 7, line 16, delete "Sw$_4$" and insert --SW$_4$--;

Signed and Sealed this

Twenty-second Day of September, 1992

Attest:

DOUGLAS B. COMER

Attesting Officer     Acting Commissioner of Patents and Trademarks